United States Patent [19]
Merrill et al.

[11] Patent Number: 5,333,257
[45] Date of Patent: Jul. 26, 1994

US005333257A

[54] SYSTEM FOR DISPLAYING SELECTED ASSEMBLY-FACILITY SEATING VIEWS

[75] Inventors: William E. Merrill; John A. Rhebergen; Robert Delgado, all of Houston, Tex.

[73] Assignee: C/A Architects, Inc., Houston, Tex.

[21] Appl. No.: 743,511

[22] Filed: Aug. 9, 1991

[51] Int. Cl.⁵ .............................. G06F 15/62
[52] U.S. Cl. ....................... 395/161; 395/155
[58] Field of Search ............ 364/400, 401, 402, 403, 364/407, 578; 358/93, 104; 395/155, 161, 600

[56] References Cited

U.S. PATENT DOCUMENTS

| | | | |
|---|---|---|---|
| 3,750,103 | 7/1973 | Angus et al. | 340/153 R |
| 4,449,186 | 5/1984 | Kelly et al. | 364/407 |
| 4,931,932 | 6/1990 | Dalnekoff et al. | 364/407 |
| 5,151,692 | 9/1992 | Hirahara | 340/825.28 |

*Primary Examiner*—Heather R. Herndon
*Attorney, Agent, or Firm*—Arnold, White & Durkee

[57] ABSTRACT

A system for automatically displaying selected views of an assembly facility (e.g., an arena, coliseum, concert hall, convention center, events center, lecture hall, opera house, race track, sports venue, stadium, theater, velodrome, or the like) from selected seating areas thereof. The system operates in conjunction with existing external software for generating tickets for assembly-facility events. The system of the present invention allows the ticket customer to see an approximation of the view from a particular seat for a particular event configuration. The system may be implemented using conventional CAD Computer Aided Design hardware. In one embodiment, the system may be implemented as an "automated teller machine" (ATM) for unattended ticket selection and sales.

6 Claims, 15 Drawing Sheets

CROWDS.BAS

SEARCH FOR
NEAREST
MATCHING
SEAT LOCATION
SUBROUTINE

CROWDS.BAS

SCREEN
HEADER
SUBROUTINE

SYSTEM FOR DISPLAYING SELECTED ASSEMBLY-FACILITY SEATING VIEWS

BACKGROUND OF THE INVENTION

The invention relates to a system, including a method and apparatus for performing the method, for automatically displaying selected views of an assembly facility (e.g., an arena, coliseum, concert hall, convention center, events center, lecture hall, opera house, race track, sports venue, stadium, theater, velodrome, or the like) from selected seating areas thereof.

The Appendices sets forth copyrighted subject matter. No objection is made to reproduction of the Appendices solely in connection with reproducing any patent that may issue from this application, but all other rights under copyright law are reserved.

SUMMARY OF THE INVENTION

The system of the invention operates in conjunction with existing external software for generating tickets for assembly-facility events. Such external ticketing software typically keeps track of unsold seats available for a specific event in a data base, and often uses a prioritized seating scheme to offer seats to customers in a predetermined order (normally biasing in favor of offering less-desirable seats), in the hope of selling more tickets. Current ticketing programs are believed to function with no capability to let a customer see the view that he or she would experience from a seat being offered. In contrast, the system of the present invention allows the ticket customer to see an approximation of that view for a particular event configuration.

BRIEF DESCRIPTION OF THE DRAWINGS

Like reference numerals are used to refer to the same components and parts in all of the following Figures.

DETAILED DESCRIPTION OF SPECIFIC EMBODIMENTS

OVERVIEW OF SYSTEM OPERATION

Figure 1:
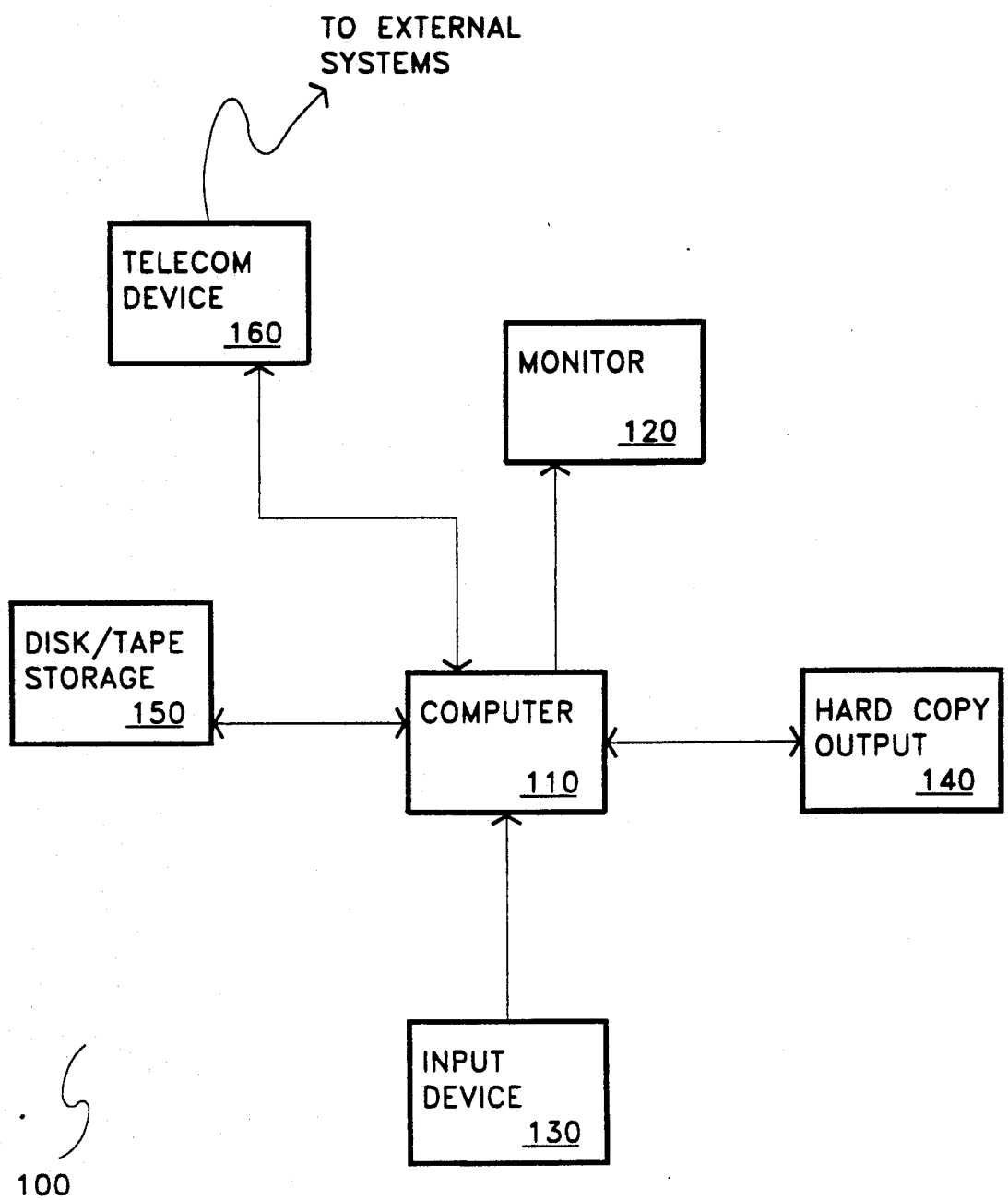
FIG. 1 is a block diagram of hardware components used in an illustrative implementation of the invention.

Referring to FIG. 1, an illustrative system 100 in accordance with the invention is implemented on a conventional general-purpose digital computer subsystem 110. An overview of the system's operation is presented in the following paragraphs to aid understanding of the general structure of the system 100.

Figure 2:
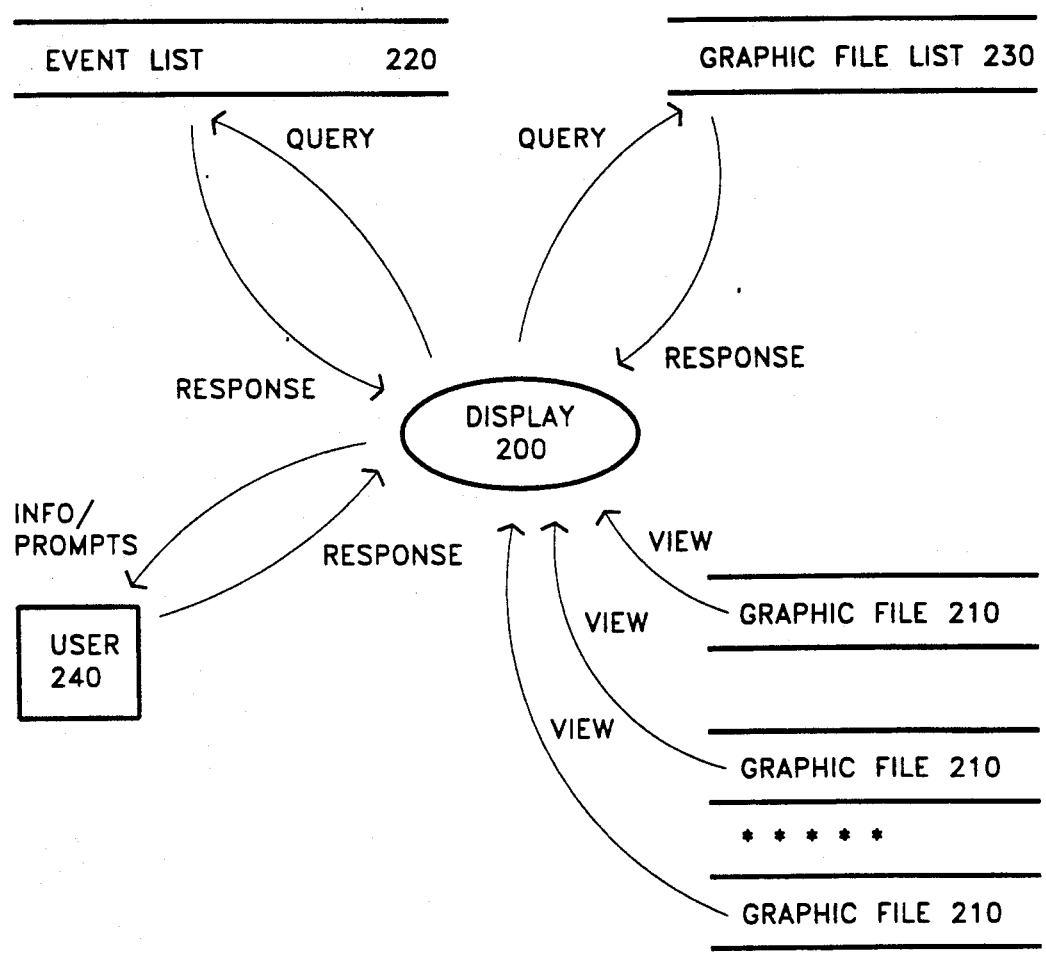
FIGS. 2 and 3 are data flow diagrams of a generalized program and a specific set of programs for operating the hardware shown in FIG. 1 in accordance with the invention.

The operation of a general-case system whose hardware is shown in FIG. 1 is depicted in a Yourdon-DeMarco data flow diagram in FIG. 2. A DISPLAY program 200 is executed by the computer subsystem 110. On a monitor 120, the DISPLAY program shows a user 240 a list of upcoming events at the facility, e.g., basketball games and the like, using information maintained in an EVENT LIST file 220, which may be stored in the disk storage 150. The user may indicate which event is of interest (i.e., the event for which he or she wants to buy a ticket) via a user input device 130 such as a keyboard or mouse. The DISPLAY program 200 consults a GRAPHIC FILE LIST file 230 to determine what views, approximating the available seating for the selected event, are available. The DISPLAY program may show the user a sequence of promotional views of different seating possibility, and/or may prompt the user to enter a desired seat selection. In either case, the DISPLAY program identifies a suitable graphic file 210 for display as approximating the view from the seat in question.

(It will be understood by those of ordinary skill that references herein to the operation of a program, e.g., to the operation of the DISPLAY program, is a convenient shorthand for the operation of the computer subsystem 110 under control of the program in question.)

Figure 3:
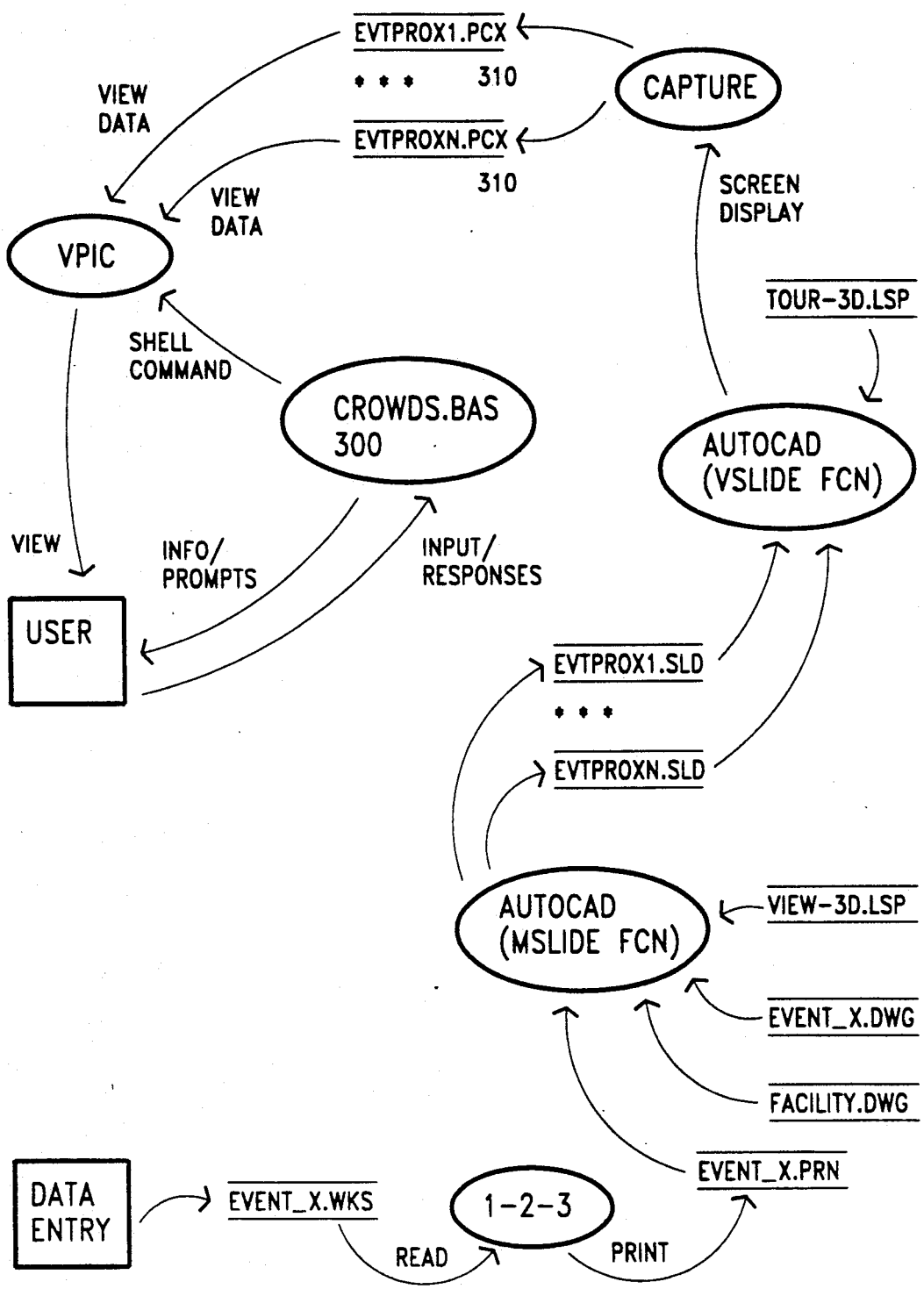
Figure 4:
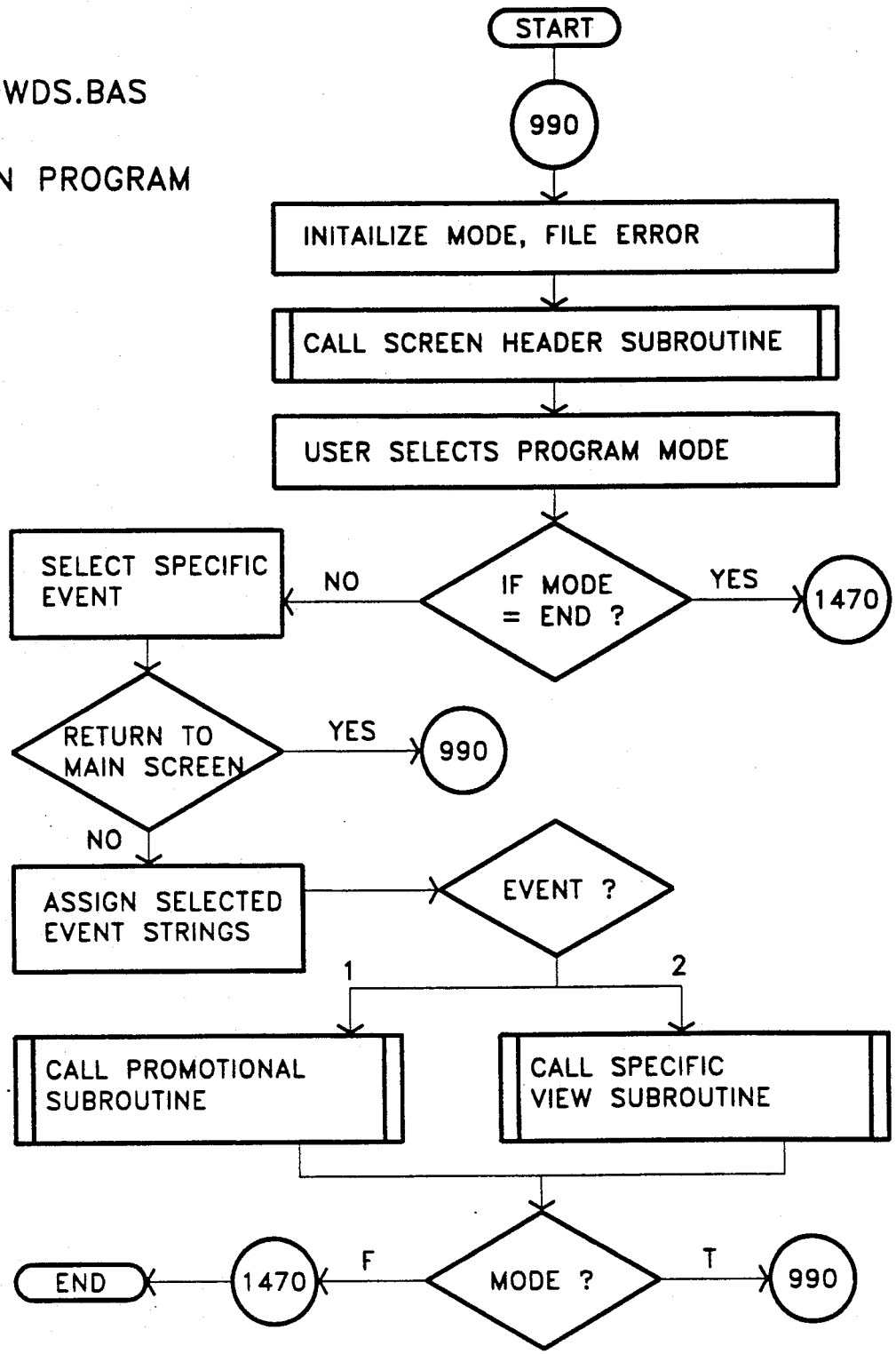
FIGS. 4 through 11 comprise a flow chart of certain operations performed by one of the specific programs shown in FIG. 3.
Figure 5:
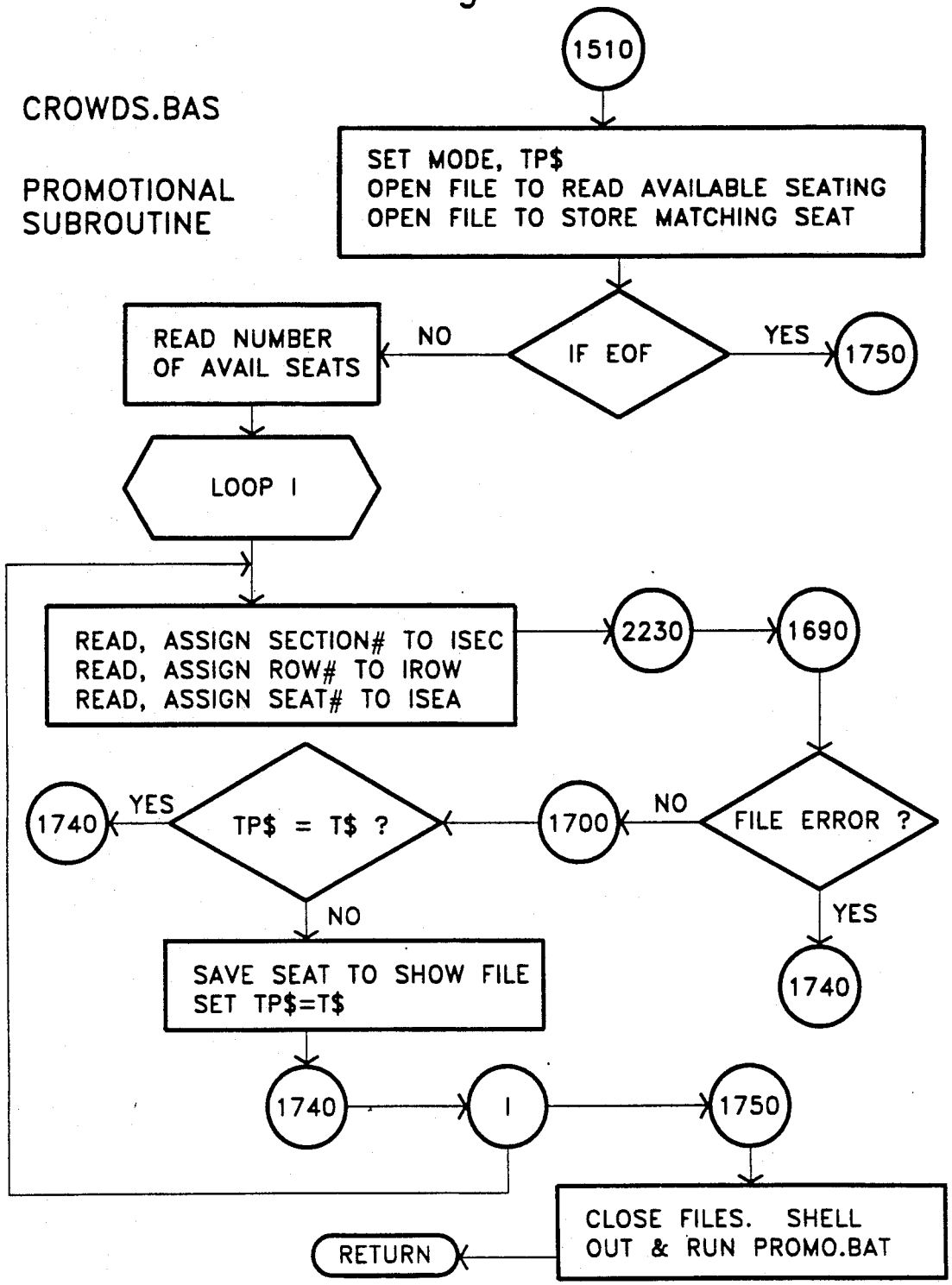

The source code of one implementation of the DISPLAY program, namely the BASIC program CROWDS.BAS, is listed in Appendix 1. A Yourdon-DeMarco data flow diagram of CROWDS.BAS is depicted in FIG. 3. The general operation of the program is shown in flow-diagram form in FIGS. 4 through 11; three-and four-digit reference numerals in those Figures refer to line numbers in the CROWDS.BAS program as shown in Appendix 1.

As illustrated in FIGS. 3 through 11, the CROWDS.BAS program 300 operates in two overall modes, automatic and interactive. Referring again to FIG. 3, in each mode the execution of CROWDS.BAS program 300 results in the display of one or more of N graphics files 310 each showing the view from a "proxy" seat for the event in question; these files are labeled in FIG. 3 as EVTPROX1.PCX through EVTPROXN.PCX. These graphics files 310 are stored, e.g., in the disk storage 150, in a convenient graphics format such as the well-known PCX format. Each graphic file 310 depicts a perspective view from a specific seat location within the facility in question. The graphic files are created from a screen capture of a hidden-line perspective view, of the kind well known in the architectural arts, that is in turn generated by a computer-assisted design (CAD) program which utilizes a data file that serves as an electronic model of proxy seats in the facility, all as discussed in more detail below.

As illustrated in Appendix 1 and in FIGS. 3 through 11, in automatic mode CROWDS.BAS prompts the system user to select a specific event, then executes a looping promotional display, showing on the computer subsystem's monitor 120 a sequence of available views for the selected event. The selection of views for this automatic display is based on available seating information extracted from an external ticketing software data base, e.g., by reading an external data base file in any convenient manner. (Data extraction of this kind is conventional and thus is not discussed further.) Available-seating promotional files, such as the files BASKET [ball] and CIRCUS shown in Appendixes 2 and 3 and used with CROWDS.BAS, may be created to show the number of entries or available seats.

CROWDS.BAS may switch to interactive mode if the user activates the input device 130 by pressing an appropriate command key (or mouse button, touch screen area, etc., depending on the configuration of the input device). The switch may occur at the end of, or in some implementations may interrupt, the promotional display. As shown in Appendix 1 and FIG. 6, in interactive mode CROWDS.BAS prompts the user to enter a tentative seat selection, e.g., by asking that the user specify a section, row, and seat number. Alternatively, CROWDS.BAS may suggest a seat selection (based on information extracted from the external ticket data base as noted above, or based on the proxy seat view being displayed when the promotional loop was interrupted by the user), which the user could select by an appropriate command key or other response.

Figure 6:
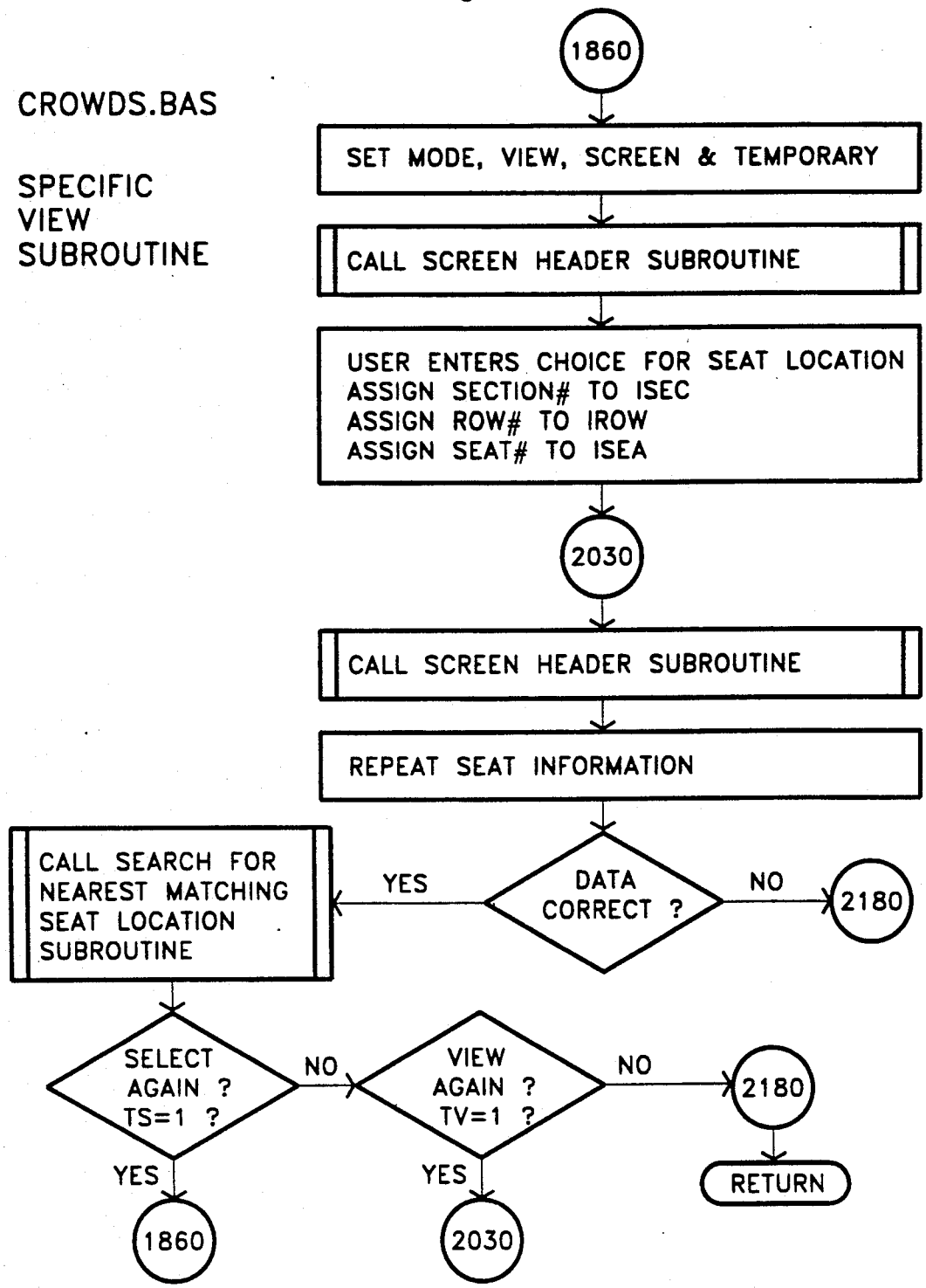
Figure 7:
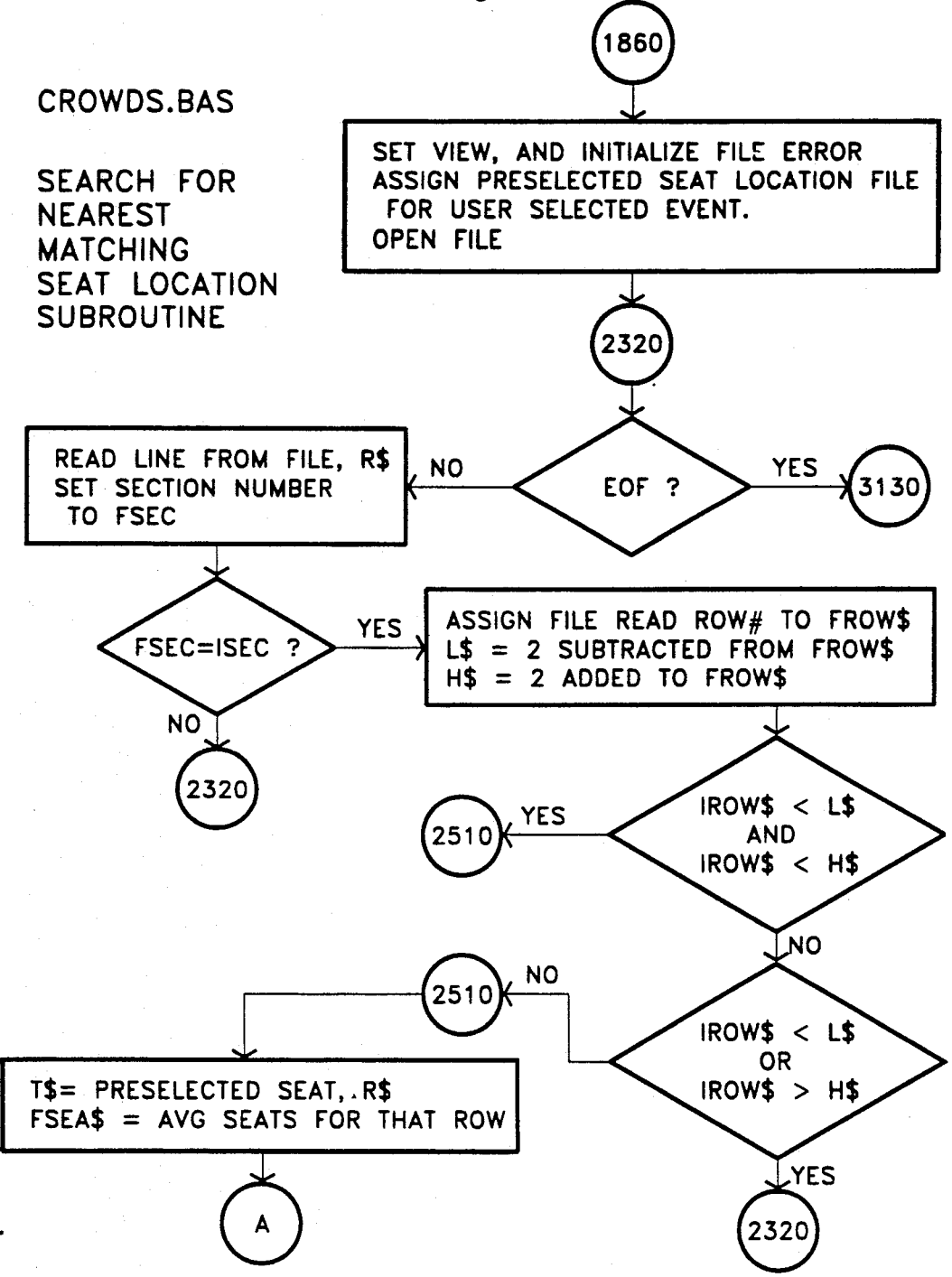
Figure 8:
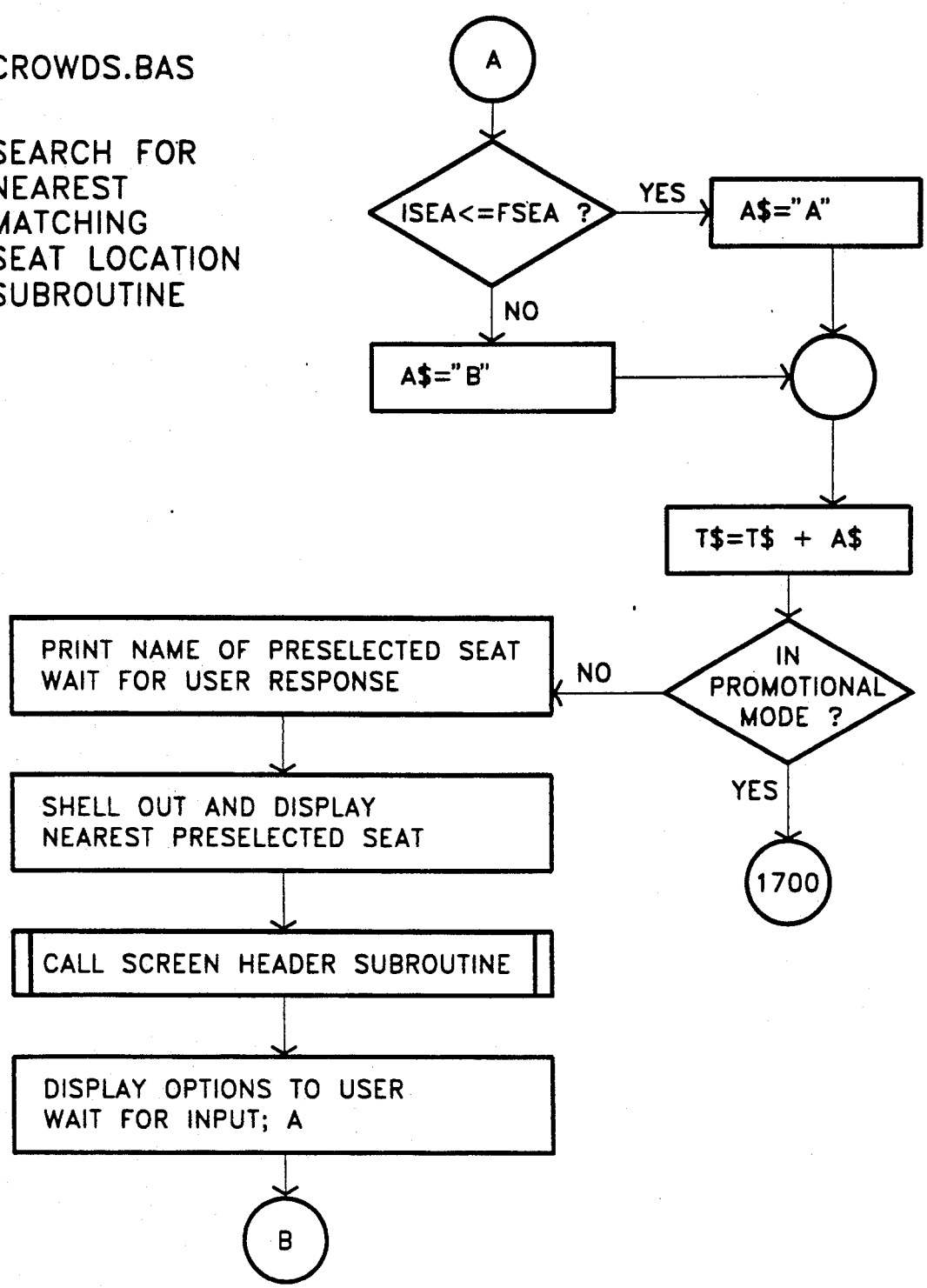
Figure 9:
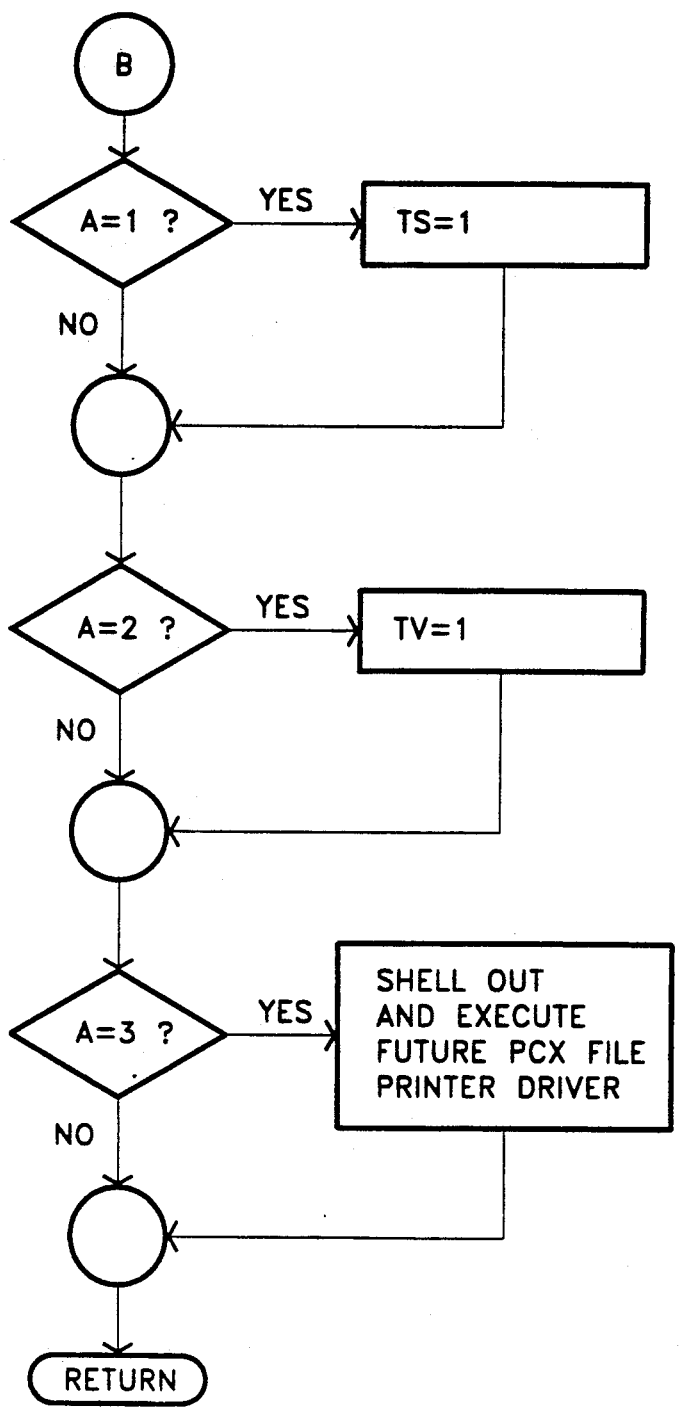
Figure 10:
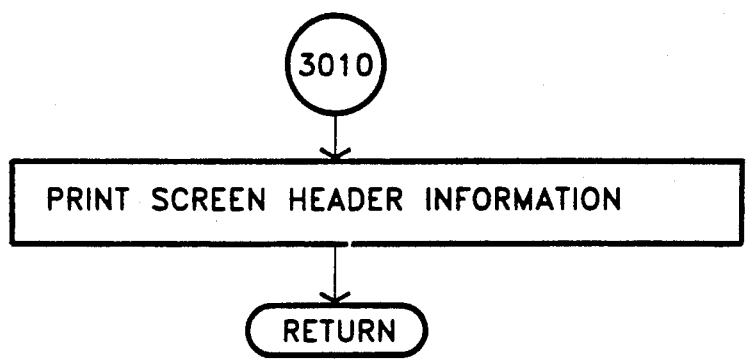
Figure 11:
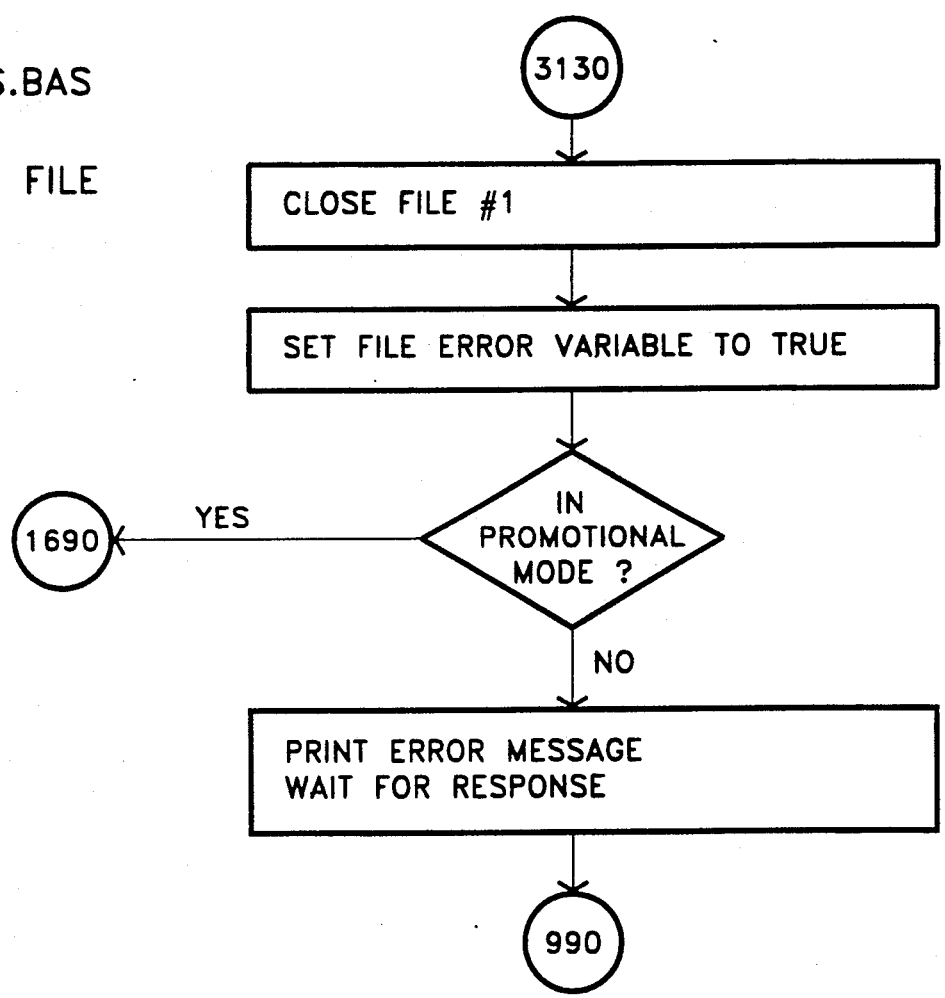

Once the user has made a tentative seat selection, CROWDS.BAS searches an appropriate configuration data file such as BB.PRN or CIRCUS.PRN, shown in Appendixes 4 and 5, indicating predetermined seat selections for which graphic depictions or views are available. The search goal is to find a "proxy" seat whose 3D view corresponds as closely as possible to the view from the user's tentatively selected seat. One search technique is shown in FIGS. 6 through 8.

When a proxy seat is found, CROWDS.BAS then displays a graphic file 310 corresponding to that proxy seat. It does this by "shelling out" (invoking a secondary copy of the command processor) to a stand-alone display program VPIC. Typical graphic-file views are shown in FIGS. 12 and 13.

Figure 12:
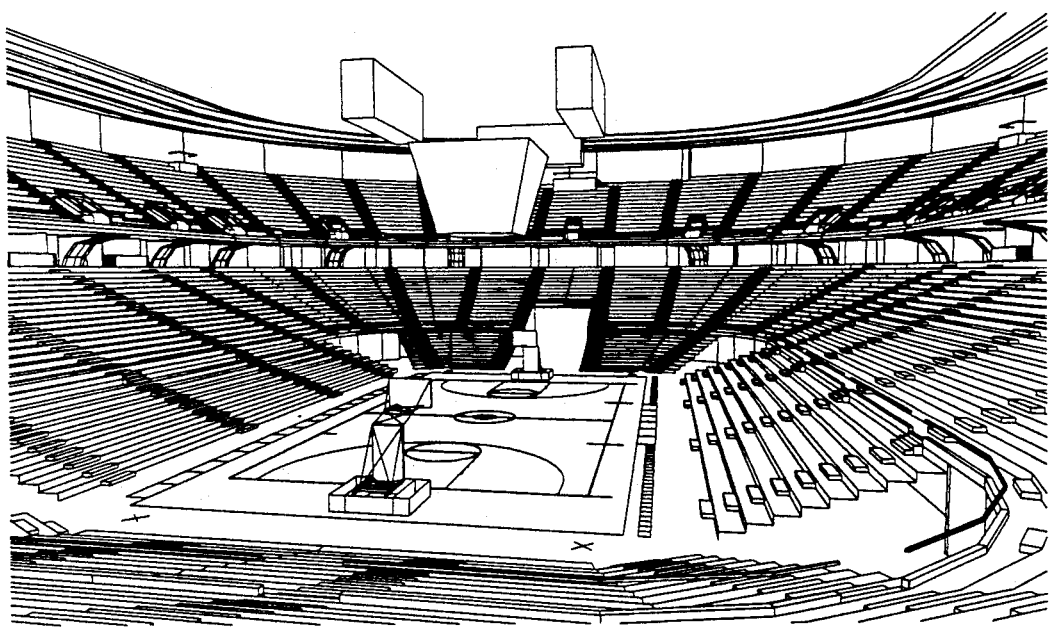
FIGS. 12 and 13 are perspective views of a facility as seen from a proxy seat, approximating the view from a selected seat.
Figure 13:
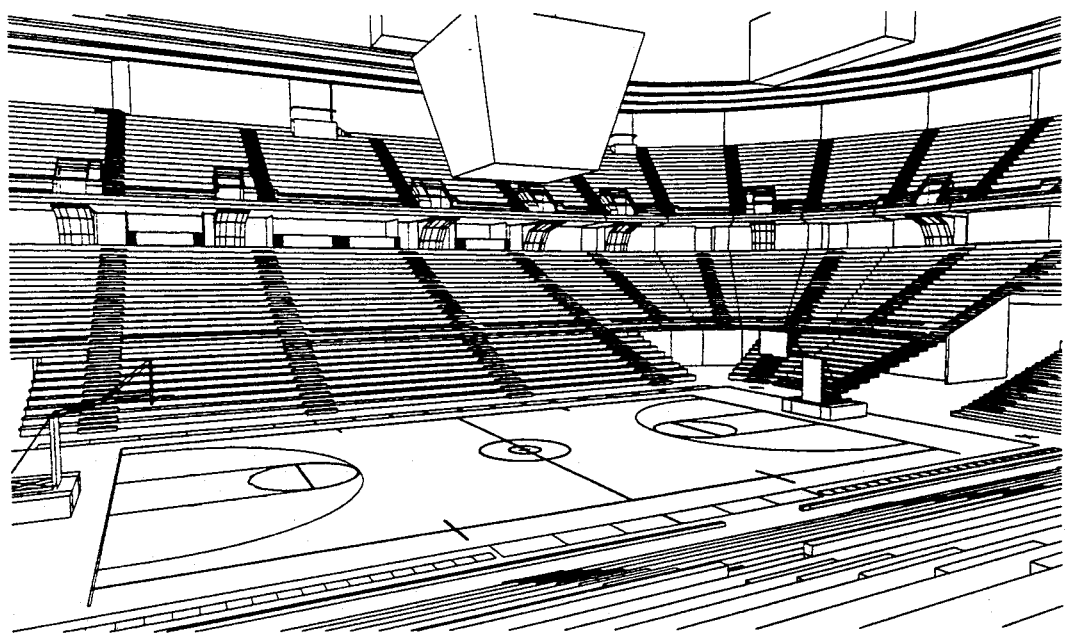
Figure 14:
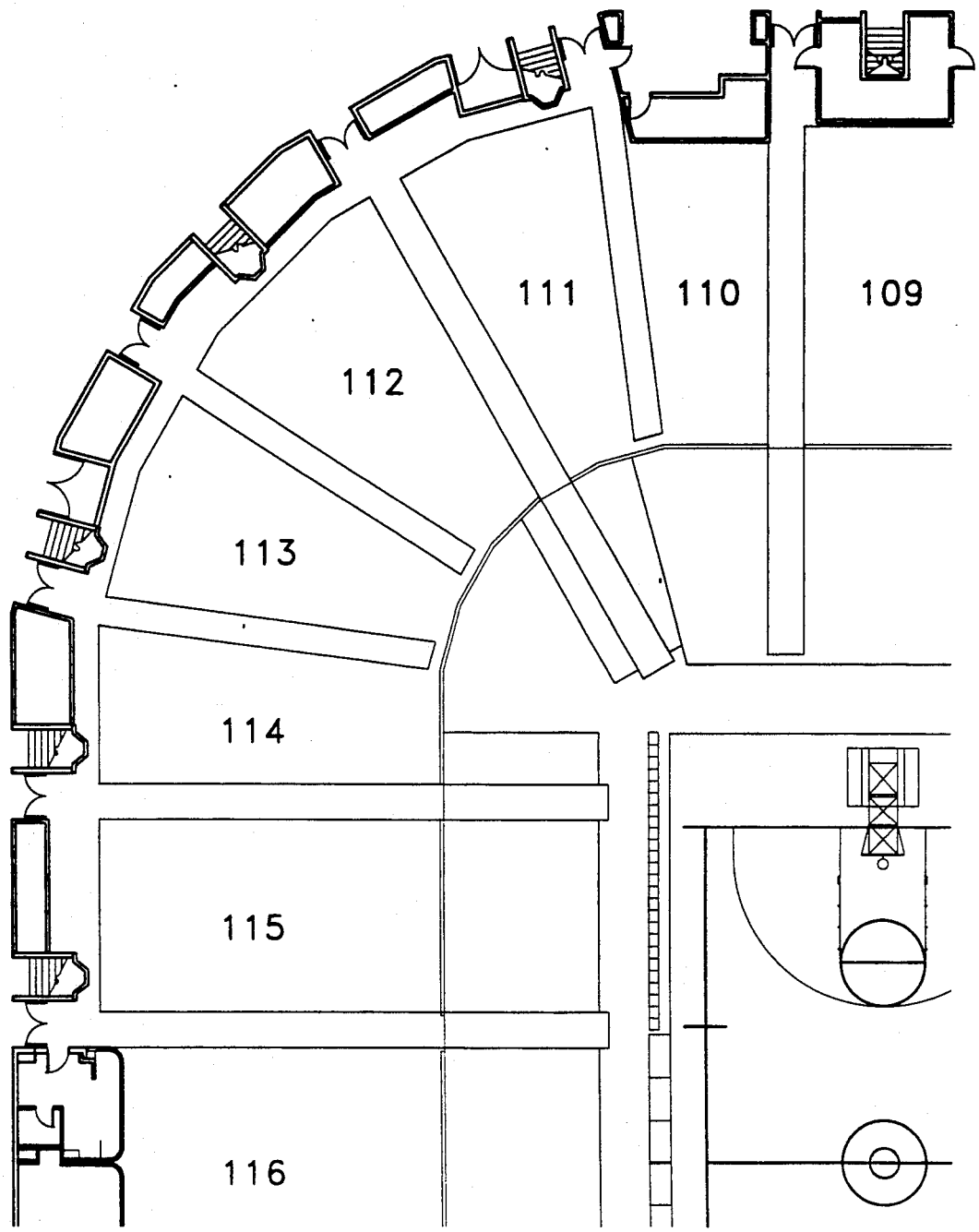
FIGS. 14 and 15 are plan views of a portion of a facility.
Figure 15:
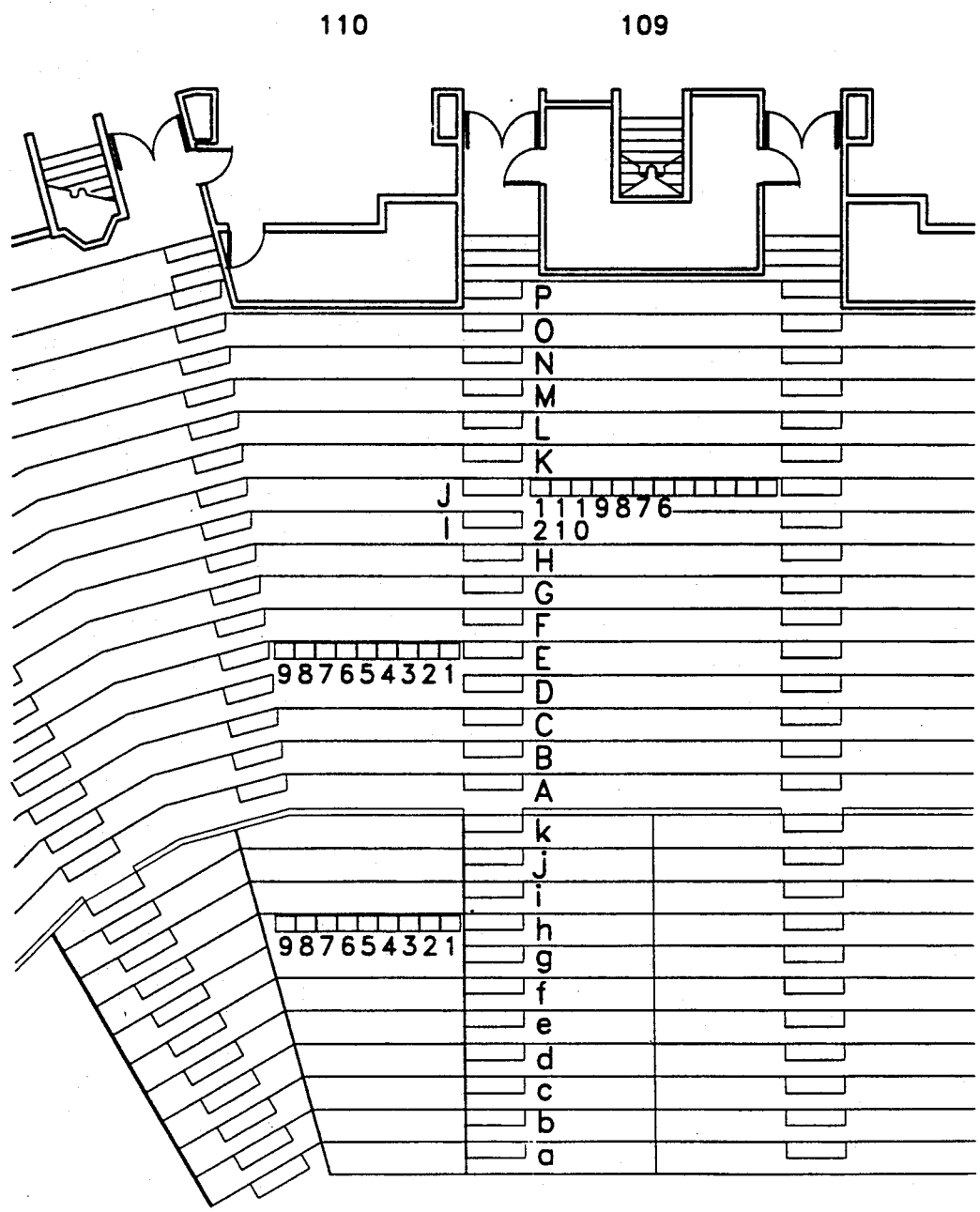

CROWDS.BAS may print out, on a hard copy output 140, a copy of the graphic file such as shown in FIGS. 12 and 13 that can be taken away by the customer for future reference, e.g., to show others in a group of people purchasing tickets together where they will each be sitting. The printout could also include plan views of the area of the seats such as those shown in FIGS. 14 and 15.

More detail concerning the illustrative system is presented in the following sections.

HARDWARE SYSTEM

As noted above and referring again to FIG. 1, an illustrative system 100 in accordance with the invention may be implemented by programming a suitable computer In one embodiment, the system 100 includes a computer 110 such an NEC Powermate 386/33 mHz computer with an Intel 80386 central processing unit (CPU) operating at approximately a 33 mHz clock speed, 8 megabytes of read-write random access memory (RAM), an Intel 80387 numerical co-processor chip for performing mathematical computations, a 300 megabyte fixed (hard) disk drive for high-capacity data storage (shown as 150 in FIG. 1), and a Calcomp Color Master Plus plotter for generating hard copy output (shown as 140 in FIG. 1). In more sophisticated embodiments, a telecommunications device 160 such as a modem (e.g., a Hayes FX0020 9600 bits per second bps Fax-Modem card) may be employed for on-line telecommunications with other computers, e.g., computers maintaining the external ticket data base. The monitor 120 may be an NEC 4D color monitor driven by a Video 7 VRAM graphics adapter circuit card with 512K of RAM. The input device 130 may include a keyboard and/or a Microsoft serial mouse (not shown). All of these subsystems and components are well known and widely available through dealers, mail-order houses, and the like.

Those skilled in the art having the benefit of this disclosure will quickly recognize that a wide range of equivalent hardware systems can readily be used. For example, the computer 110 might include an Intel 80286 or 80486 CPU, or for that matter a Motorola 68000 CPU or a RISC CPU (although in that case the supporting software would of course be routinely changed). A leased-line connection might be used for the telecom device 160 in place of a modem. As an alternative to the use of a plotter as the hard-copy output 140, a laser printer such as a Hewlett-Packard LaserJet III D with 2 mb RAM, or even any of a great many brands of nine-wire dot matrix printer, could be used.

SOFTWARE DETAILS

Third-Party Software.

In the illustrative embodiment described here, the hardware system 100 is operated by computer software that includes the following commercially available third-party software:

| | |
|---|---|
| WINDOWS 3.0 | Microsoft Corporation, Redmond, Washington. The illustrative hardware system 100 may use Windows 3.0 running under Microsoft MS-DOS 5.0, or under MS-DOS version 3.3 or higher. It is contemplated that in alternative embodiments, any convenient operating environment may be used (e.g., OS/2 with Presentation Manager; various versions of UNIX and windowing systems such as X Windows; and the like). |
| GW-BASIC interpreter | Microsoft Corporation. Used to create and interpret (run) the BASIC-language source code programs described below. Equivalent alternatives might include other BASIC interpreters by any of a number of vendors, and/or other languages such as C, C++, or PASCAL. |
| EDLIN text editor | Microsoft Corporation. Used to create LISP programs as described below; also used to modify data files. Any convenient text editor may be equivalently used. |
| LOTUS 123 | Lotus Development Corporation, Cambridge, Mass. Used to create spreadsheet files containing three dimensional coordinates; the PRINT function is used to generate *.PRN files of the kind discussed above. |
| AUTOCAD | Release 11.0, AutoDesk, Inc., Sausalito, California. Used to create model of facility and generate three dimensional views. It is contemplated that alternative computer-assisted design (CAD) software such as CadVance, Microstation, DataCad, or Intergraph, all of which can generate a hidden line perspective image, can equivalently be used with appropriate changes to implementing software. Alternatively, commercially available 3D rendering/shading software such as Pixar, Renderman, and Autoshade can also be equivalently used. |
| AUTOLISP interpreter | AutoDesk, Inc. Program language used to interact with AutoCad. |
| VPIC graphic file display program | Bob Montgomery, 543 Via Fontana #203, Altamonte Springs, Florida, 32714. Any convenient program for displaying graphics files stored in the well-known PCX format maintained by Zsoft Corporation, 450 Franklin Road #100, Marletta Georgia, 30067 (or for displaying graphics files in other format(s) that may be used in a specific implementation) may equivalently be used. |
| Harvard Graphics 3.0 | Software Publishing Corporation, Mountainview, California. Capture, a program supplied with Harvard Graphics, may be used to capture the screen image of a hidden-line image created in Autocad. |
| Hijaak graphics conversion and screen capture utility. | Inset Systems, 71 Commerce Drive, Brookfield Connecticut. May be used to convert vector-based images to raster-based images. |

Custom Software Routines.

The software controlling the hardware system 100 may also include the following programs, the source code of which is included in the Appendixes:

| | |
|---|---|
| CROWDS.BAS | BASIC program overseeing visual display as discussed above. |
| VIEW-3D.LSP | LISP program for reading a file containing 3D coordinates and matching view names. |
| TOUR-3D.LSP | LISP program for displaying Autocad slide files by reading a ASCII file containing slide file names. |
| 3D-BOWL.MNU | AutoCad menu used to add Z attributes to two dimensional entities to build a three dimensional electronic model. |

CREATION OF DATA-FILE "PROXY SEAT" MODEL OF FACILITY

A first step in implementing a system in accordance with the invention is the creation of a data file or model that represents views from specific proxy seats in a facility. The general structure of the data file includes a series of specific proxy seat locations (e.g., by section, row and seat numbers) as well as corresponding coordinates for each proxy seat (e.g., X, Y, and Z Cartesian coordinates, polar coordinates, or other convenient coordinates). This data may be gathered in any convenient manner as well known to those of ordinary skill in the architectural arts.

The data may be organized in a spreadsheet format with each proxy seat being assigned to a row, and with the section/row/seat and the X, Y, and Z coordinates each being assigned to a column in the row. A print function in the spreadsheet program may be used to generate ASCII files such as that shown in the file TOUR-3D.PRN, attached as Appendix 6, in which each proxy seat is shown immediately followed by its X and Y coordinates in feet and its Z coordinate in inches. The Z coordinate in any given implementation may be based on the height of the floor at the seat location, adjusted as desired to take into account the average customer height-of-eye.

It may be helpful to create the model with the center of both the facility and the event floor at Cartesian coordinates (0,0,0). This will allow coordinates to be manipulated by merely change the sign (+ —) and reusing the absolute values which locate a specific proxy seat location to generate the opposite hand views. Thus, views for an entire facility might be created by exploiting a quarter of the number of the specific proxy seating locations in the facility.

The number of proxy seats required to model a specific facility will vary with the facility design, event configuration, and scope of work commissioned by the facility manager. For example, a manager might wish to have each individual seat in an expensive seating section (e.g., a founders' box) be represented by an individual graphic file. In all likelihood, the number of proxy seats must be determined by experimentation in each case. Preliminary proxy seating schemes that would represent views from specific seating locations can be generated as discussed in the next section previewed (e.g., by using a LISP program such as TOUR-3D.LSP, attached as Appendix 7), and edited as necessary.

In the illustrative implementation, a model of a facility partially depicted in FIGS. 12 and 13 includes one proxy seat for every thirty seats and for every fifth row ("proxy row") per section of the facility. Each proxy row has a maximum of two proxy seats to represent the views from that row for a specific section.

It may be helpful to enter the data for the facility completely in two dimensions before starting any three dimensional manipulation of the data file. Baseline versions of the data file may be copied and achieved with only those layers that are essential for the creation of the computer model. These baseline versions will thus provide benchmarks for future manipulations of the model without the confusion of editing a fully developed model in its later stage.

Experimentation with various focal lengths, to determine the angle of vision which best represents the view and the distance relationship from a proxy seat location may be required prior to perspective view generation. Individual facility design and event configurations will alter focal lengths from one implementation to another.

Ideally, only those graphic entities (e.g., beams, pillars, etc.) in the facility that will be seen from a proxy seat should be included in the final view as depicted the corresponding graphic file 310. Other "layers" or graphic entities which are not seen in the image may be deleted to produce smaller graphic files as well as reducing the amount of time to perform the hidden-line removal process for each view from a specific seat location.

The size of the resulting data-file model will be based on factors that include the facility design complexity, the extent of detail used to create the model of the facility, the geometric seating layout, the number of proxy seat locations that are chosen to model the facility, the number of floor event configurations produced, the complexity of specific event staging (e.g., whether musical acts or theatrical productions use towers or other stage props), three dimensional modeling techniques used to create the model, and the operator's familiarity with the CAD software being used.

CREATION OF PERSPECTIVE VIEWS FOR PROXY SEATS

Once the facility has been modeled as discussed above, a CAD program may be used to generate a perspective view as seen from each proxy seat. The LISP program VIEW-3D.LSP, shown in Appendix 8, may be used in the illustrative implementation in conjunction with the AUTOCAD ad AUTOLISP programs more fully identified above.

In conjunction with VIEW-3D.LSP, and utilizing information about the facility (e.g., floor plan, scoreboard location, etc.) stored in one or more drawing files, shown as FACILITY.DWG in FIG. 3, AUTOCAD automatically generates and stores numerous hidden-line views by reading an ASCII file containing a slide file name and the corresponding seating location for a specific seat. AUTOCAD also reads other .DWG files as necessary to obtain other visual information about the facility. Each view so generated is saved by AUTOCAD in a .SLD "slide" file, shown as N files in FIG. 3 labeled EVTPROX1.SLD through EVTPROXN.SLD.

As briefly noted in the previous section, AUTOCAD may also be used in conjunction with the LISP program TOUR-3D.LSP to preview all created slide flies to verify correct data entries and to review the resulting hidden-line views.

It should be noted that the color selections made in AUTOCAD may be affected by the use of screen capture programs to generate graphic files; some screen capture programs may alter the original color values.

During the conversion from two dimensional image to three dimensional model the AUTOCAD operator should posses a thorough architectural understanding of all 3D entities and geometric relationships that are inherent to a facility of the type under consideration. The operator should note any symmetry or repetition due to geometric layout of the facility. The MIRROR and ARRAY-POLAR commands can reduce the amount of work required to create a 3D model. Custom AUTOCAD menus such as that of 3D-BOWL.MNU, included as Appendix 9, can allow the operator to select any graphic object(s) and move selected object(s) a given distance along the Z axis and thus can help reduce implementation time.

After the AUTOCAD program generates the appropriate views, the operator may a screen capture of the AUTOCAD slide file to convert each view into a PCX file raster format. This conversion allows other graphic programs (some of which do not require a math coprocessor) to display the image. A raster image involves the description of the color for each possible dot on a given image. A raster image provides a photo realistic image that can be printed on devices that print dots.

Equivalently, vector-format implementations can be readily made by those of ordinary skill having the benefit of this disclosure. As is well known, vector files are an assimilation of mathematically described or coded objects used to create an image. Software to display this type of image commonly requires a floating point coprocessor (e.g., an Intel 80387, a Weitek coprocessor, or equivalent) and greater hardware support. Such an implementation can be used to create an easily transported view that can be displayed with little or no expertise required by the end user. It should be noted that PostScript systems can commonly support either a raster or vector image.

The system 100 may include some or all of the following features with appropriate changes made to CROWDS.BAS and/or to the hardware configuration as briefly described below.

Development and maintenance of a 3D library consisting of models of different floor event configurations for a facility (i.e., basketball, hockey, and various theatrical or musical stage configurations) may aid in developing a proxy-seat model of the facility. In addition, insertion of different event floor configurations (e.g., views of special staging for rock concerts) can assist both facility managers and facility designers in determining sight-line related issues for various seating arrangements.

The use of a raster graphic format allows scanned photographic images to be superimposed as part of the graphic file (e.g., through known digitized "clip art" techniques) or, indeed, to be used in lieu of the graphic file. Thus, views from selected seat locations of existing facilities can be captured photographically, digitally scanned or enhanced and either incorporated into the graphic file or, if desired, displayed directly in a promotional loop or in response to a customer's tentative seat selection using a suitably modifed CROWDS.BAS.

Third-party graphics may be incorporated in the display sequence (either as part of the promotional loop and/or during display of specific seat information). Such graphics might provide promotion and information for selected events, or other advertisements.

A system 100 can readily be configured as an "automated teller machine" (ATM), with suitable armoring, a card reader to accept credit cards (which may comprise part of the input device 130), and suitable programming to prompt the user for his PIN number, for 24-hour unattended service. The hard copy output 140 may comprise one or more printers for printing tickets, facility maps, and the like.

A two dimensional representation of the event configuration may be displayed with highlighted areas which represents the current status of available seat locations in the facility. This representation can be updated to reflect changes in seat availability on a timely basis.

SOME POSSIBLE OPTIMIZATIONS

To provide the best performance and shortest development time the following items should be considered.

Routine hard disk optimization and file maintenance will improve disk access time and reduce the time required for image regeneration. Norton Utilities or any comparable third party hard disk utilities should be installed on any system that performs CAD oriented work.

Different AutoCad hardware configurations may be required due to the creation of slide files in EGA resolution with no menu, dialogue, command prompt or pull down menu areas. This will create a AutoCad slide that will map to the maximum screen area at EGA resolution.

By creating several sub-directories under the main AutoCad directory and assigning different paths to the AutoCad configuration files, multiple configurations for AutoCad can be easily accommodated.

Current versions of MS-DOS place a limit on the number of files a program can open at one time. The number of files that can be open at one time is controlled by the FILES statement in the CONFIG.SYS file. AUTOCAD can open several files simultaneously and can sometimes exceed the DOS default limit of 8 files. Therefore, it is recommended that the FILES statement be modified to at least 40 in CONFIG.SYS. (APPENDIXES 1-9 FOLLOW)

APPENDIX 1

CROWDS.BAS

```
1
2
3
4
5
610 GOTO 990
```

```
720 REM*********************************************************************
830 REM
940 REM    Program Name: CROWDS.BAS                    Release: 7.91
1050 REM
1160 REM   Current Date: 31 July 1991
1270 REM   Last Edit:    30 July 1991
1380 REM   Initial Date: 8 July 1991
1490 REM   Written By:   Robert Delgado
15100 REM                C/A Architects, Inc.
16110 REM
17120 REM  Purpose:
18130 REM
19140 REM     The purpose of the this program is to provide a visual connection
20150 REM     to existing ticketing software which operate using a prioritized
21160 REM     seating scheme. These programs function with no visual relation
22170 REM     from selected seat location.
23180 REM
24190 REM     This program allows the ticket purchaser to establish a visual
25200 REM     connection from a specific seat for a particular event configura-
26210 REM     tion.
27220 REM
28230 REM     The program is designed to operate in both an automatic and
29240 REM     interactive graphic modes.
30250 REM
31260 REM     Each mode or section of the program will read a ASCII sequential
32270 REM     file containing a list of PCX file names. Each file name represents
33280 REM     a view from a specific seat location within the building. Each
34290 REM     image was created from a screen capture of a hidden line perspective
35300 REM     view generated from an electronic model of the building.
36310 REM
37320 REM     The first section of the program is a looping promotional display.
38330 REM     Views selected for display shall be automatically be based on
39340 REM     available seating information extracted from outside ticketing
40350 REM     software and the user selection of an event.
1360 REM
2370 REM     The program assumes the ability to extract available seating infor-
3380 REM     mation (section, row and seat numbers) from third party ticketing
4390 REM     software. The promotional files were created with the number of
5400 REM     entries or available seats inserted at the start of the file.
6410 REM
7420 REM     The second section will search for a specific 3D view based on
8430 REM     the users selection of an event, section, row and seat numbers.
9440 REM     The program will then sort thru the appropriate configuration
10450 REM    data file for the nearest pre-selected seat location, then shell out
```

```
11460 REM     to display the program selected PCX file.
12470 REM
13480 REM     The program is designed to search the data file of pre-selected
14490 REM     seating locations and find the nearest matching seat location based
15500 REM     on the users choice of seat location.  Due to the design of the
16510 REM     building and seating layout, the pre-selected seating scheme that
17520 REM     best represents the building will vary from building to building.
18530 REM     Therefore, portions of this program will be modified to accommodate
19540 REM     individual buildings.
20550 REM
21560 REM
22570 REM     User Input Variables:
23580 REM     A    - Response variable
24590 REM     IEVE - Event configuration
25600 REM     ISEC - Section number
26610 REM     IROW - Row number
27620 REM     ISEA - Seat number
28630 REM     Mode - Program mode
29640 REM
30650 REM
31660 REM     Program Variables:
32670 REM     E    - Event configuration type string
33680 REM     F    - Event configuration file name
34690 REM     H    - Calculated higher row number base on FROW
35700 REM     L    - Calculated lower row number base on FROW
36710 REM     R    - Line of text read from the file
37720 REM     T    - Temporary
38730 REM     TF   - Test flag for file or seat not found
 1740 REM     TM   - Test flag for mode; 1=Promotional, 2=Selective View
 2750 REM     TS   - Test flag for Select another view w/same configuration
 3760 REM     TV   - Test flag for view slide again
 4770 REM     FSEC - Section number read from file
 5780 REM     FROW - Row number read from file
 6790 REM     FSEA - Average seat count for row read from file
 7800 REM
 8810 REM     Available Seating Files:
 9820 REM     The following files contain available seat numbers for a given
10830 REM     event configuration (information will be extracted from other
11840 REM     software):
12850 REM     Basket, Circus, Side, Hockey, Concert, Banqt
13860 REM
14870 REM     Preselected View Files:
15880 REM     The following files contain the names of PCX format files of
16890 REM     preselected views taken from various location within the bowl:
```

```
17900 REM     BB.PRN, CIRCUS.PRN, SIDE.PRN, HOCKEY.PRN, CONCERT.PRN, BANQT.PRN
18910 REM
19920 REM   Other Files:
20930 REM     SHOW.SLD    - File created containing nearest seat location
21940 REM     PROMO.BAT   - Batch file for running promotional SHOW.SLD
22950 REM
23960 REM
24970 REM   User selection of program mode
25980 REM===================================
26990 TM=0 : TF=0
271000 GOSUB 3010
281010 PRINT
291020 PRINT " 1. Promotional Loop"
301030 PRINT " 2. Specific view"
311040 PRINT " 3. End program"
321050 PRINT
331060 INPUT " Enter your selection  (1-3) ";MODE
341070 MODE=INT(MODE)
351080 IF (MODE<1) OR (MODE>3) THEN 990
361090 IF MODE=3 THEN 1470
371100 REM
381110 REM  Select specific event configuration
11120 REM===================================
21130 GOSUB 3010
31140 PRINT "Select an Event:"
41150 PRINT
51160 PRINT " 1. Basketball"
61170 PRINT " 2. Circus"
71180 PRINT " 3. Side Stage Theatrical"
81190 PRINT " 4. Hockey"
91200 PRINT " 5. Concert"
101210 PRINT " 6. Banquet"
111220 PRINT " 7. Gymnastics"
121230 PRINT " 8. Exit to main screen"
131240 PRINT
141250 INPUT " Enter number  (1-8) ";IEVE
151260 IEVE=INT(IEVE)
161270 IF (IEVE<1) OR (IEVE>8) THEN GOTO 1130
171280 IF IEVE=8 THEN 990
181290 REM
191300 REM  Assign the proper event strings
201310 REM===================================
211320 IF IEVE=1 THEN E$="Basketball" : P$="BASKET" : D$="E:\BB"
221330 IF IEVE=2 THEN E$="Circus" : P$="CIRCUS" : D$="E:\CIRCUS"
```

```
231340 IF IEVE=3 THEN E$="Side Stage" : P$="SIDE" : D$="E:\SIDE"
241350 IF IEVE=4 THEN E$="Hockey" : P$="HOCKEY" : D$="E:\HOCKEY"
251360 IF IEVE=5 THEN E$="Concert" : P$="CONCERT" : D$="E:\CONCERT"
261370 IF IEVE=6 THEN E$="Banquet" : P$="BANQT" : D$="E:\BANQ"
271380 IF IEV-=7 THEN E$="Gymnastics" : P$="GYMN" : D$="E:\GYMN"
281390 REM
291400 REM  Call the appropriate subroutine
301410 REM=================================
311420 ON MODE GOSUB 1510,1860
321430 IF TM THEN 990
331440 REM
341450 REM  END OF MAIN PROGRAM
351460 REM*************************************************************
361470 END
11480 REM/////////////////////////////////////////////////////
21490 REM  Subroutine: Promotional loop
31500 REM/////////////////////////////////////////////////////
41510 TM=1 : TP$=""
51520 REM
61530 REM  Open files P$ to read available seating extracted from third
71540 REM  party ticketing software. File "show.sld" stores seat locations
81550 REM=====================================
91560 P2$=D$+"\"+"show.sld"
101570 OPEN "I",#2, P$
111580 OPEN "O",#3, P2$
121590 IF EOF (2) THEN 1750
131600 LINE INPUT #2, R$
141610 K=VAL(R$)
151612 REM
161614 REM  Loop for reading available seat file and assigning seating information
171615 REM=====================================
181620 FOR I=1 TO K
191630 LINE INPUT #2, ISEC$
201640 LINE INPUT #2, IROW$
211650 LINE INPUT #2, ISEA$
221660 ISEC=VAL(ISEC$)
231670 ISEA=VAL(ISEA$)
241672 REM
251674 REM  Branch to searching thru preselected seat file to find nearest
261675 REM  matching seat location
271676 REM=====================================
281680 GOTO 2230
291682 REM
```

```
1683 REM  Upon return, check for file error, and if matching view already
1684 REM  has been found.  If two conditions are not met store to SHOW.SLD
1685 REM  for later execution by PROMO.BAT
1686 REM=================================
1690 IF TF THEN 1740
1700 IF TP$=T$ THEN 1740
1710 TP$=T$
1720 T$=T$+".PCX 11"
1730 PRINT#3,T$
1740 NEXT I
1750 CLOSE
1760 REM
1770 REM  Shell out and display slide show
1780 REM=====================================
1790 TP3$="cd "+D$
1800 SHELL TP3$
1810 SHELL "PROMO"
1820 RETURN
1830 REM/////////////////////////////////////////////////////
1840 REM  Subroutine: Entering specific seat information
1850 REM/////////////////////////////////////////////////////
1860 T=1 : TM=2 : TS=0 : TV=0
1870 GOSUB 3010
1880 INPUT "Section Number  (100-127 or 200-235) ";ISEC
1890 IF (ISEC>=100) AND (ISEC<=127) THEN T=0
1900 IF (ISEC>=200) AND (ISEC<=235) THEN T=0
1910 IF T THEN 1880
1920 ISEC=INT(ISEC) : T=1
1930 INPUT "Row Number  (A-P  or  a-k) ";IROW$
1940 IF (IROW$>="A") AND (IROW$<="P") THEN T=0
1950 IF (IROW$>="a") AND (IROW$<="k") THEN T=0
1960 IF T THEN 1930
1970 INPUT "Seat Number  (1-18) ";ISEA
1980 IF (ISEA<1) OR (ISEA>18) THEN GOTO 1970
1990 ISEA=INT(ISEA)
2000 REM
2010 REM  Confirm user input
2020 REM==========================================
2030 GOSUB 3010
2040 PRINT E$;" event configuration."
2050 PRINT
2060 PRINT "Section:";ISEC
2070 PRINT "Row: ";IROW$
```

```
2080 PRINT "Seat:";ISEA
2090 PRINT
2100 INPUT "Is this correct  (Y or N) ";A$
2110 IF (A$<>"y") AND (A$<>"Y") THEN 2180
2120 REM
2130 REM  Call subroutine to search for nearest preselected matching seat
2140 REM===================================
2150 GOSUB 2230
2160 IF TS THEN 1860
2170 IF TV THEN 2030
2180 RETURN
2190 REM///////////////////////////////////////////////////
2200 REM  Subroutine: Open proper configuration file containing preselected
2210 REM              views and search for nearest matching seat.
2220 REM///////////////////////////////////////////////////
2230 TV=0 : TF=0
2240 IF IEVE=1 THEN F$="BB.PRN"
2250 IF IEVE=2 THEN F$="CIRCUS.PRN"
2260 IF IEVE=3 THEN F$="" ' future data base
2270 IF IEVE=4 THEN F$="" ' future data base
2280 IF IEVE=5 THEN F$="" ' future data base
2290 IF IEVE=6 THEN F$="" ' future data base
2300 IF IEVE=7 THEN F$="" ' future data base
2310 OPEN "I",#1, F$
2320 IF EOF (1) THEN 3130
2330 LINE INPUT #1, R$
2340 FSEC$=MID$(R$,2,3)
2350 FSEC=VAL(FSEC$)
2360 IF (ISEC<>FSEC) THEN 2320
2370 REM
2380 REM  Determine if IROW is in range of + or - 2 rows of FROW
2390 REM===================================
2400 FROW$=MID$(R$,5,1)
2410 T=ASC(FROW$)
2420 T1=T-2
2430 T2=T+2
2440 L$=CHR$(T1)
2450 H$=CHR$(T2)
2460 IF (IROW$<L$) AND (IROW$<H$) THEN 2510
2470 IF (IROW$<L$) OR (IROW$>H$) THEN 2320
2480 REM
2490 REM  Determine if ISEA is higher or lower than Avg Num of seats in FROW
2500 REM===================================
2510 T$=MID$(R$,2,7)
```

```
2520 T1$=MID$(R$,2,5)
2530 FSEA$=MID$(R$,7,1)
2540 FSEA=VAL(FSEA$)
2550 IF (ISEA<=FSEA) THEN A$="A" ELSE A$="B"
2560 T$=T$+A$
2570 T1$=T1$+A$
2580 CLOSE #1
2590 REM
2600 REM  Test for promotional mode
2610 REM=================================
2620 IF TM=1 THEN 1700
2630 REM
2640 REM  Set proper directory and display PCX file
2650 REM=================================
2660 PRINT
2670 PRINT "Slide name is ";T1$;" press ENTER"
2680 PRINT
2690 A$=INKEY$
2700 IF A$="" THEN 2690
2710 W$=D$+"\"+T$+".PCX /A"
2720 W$="VPIC "+W$
2730 SHELL W$
2740 REM
2750 REM  Ask user for further input
2760 REM=================================
2770 GOSUB 3010
2780 PRINT "Do you wish to:"
2790 PRINT
2800 PRINT " 1. Select another seat for a ";E$;" event"
2810 PRINT " 2. View the slide again"
2820 PRINT " 3. Produce hardcopy of view"
2830 PRINT " 4. Exit to main screen"
2840 PRINT
2850 INPUT " Enter Number  (1-4) ";A
2860 A=INT(A)
2870 IF (A<1) OR (A>4) THEN 2770
2880 IF A=1 THEN TS=1
2890 IF A=2 THEN TV=1
2900 REM
2910 REM  Print view if requested
2920 REM=================================
2930 WHILE A=3
2940 REM    Future print PCX file driver
```

```
2950 GOTO 2770
2960 WEND
2970 RETURN
2980 REM/////////////////////////////////////////////////////
2990 REM   Subroutine: Screen header
3000 REM/////////////////////////////////////////////////////
3010 CLS
3020 PRINT
3030 PRINT "Send in the Crowds          Texas A & M Special Events Center"
3040 PRINT "Ticketing Software                       Release: 7.91"
3050 PRINT
3060 PRINT "Enter your choice for a specific event and seat location, then the"
3070 PRINT "computer will display the closet 3D perspective view for that seat."
3080 PRINT
3090 RETURN
3100 REM/////////////////////////////////////////////////////
3110 REM   End of file and future data base trap
3120 REM/////////////////////////////////////////////////////
3130 CLOSE #1
3140 TF=1
3150 IF TM=1 THEN 1690
3160 PRINT
3170 PRINT "Requested seat not on file."
3180 BEEP
3190 PRINT
3200 PRINT "Press any Key"
3210 A$=INKEY$
3220 IF A$="" THEN 3210
3230 GOTO 990
```

APPENDIX 2

CIRCUS File

| | |
|---|---|
| 1 | |
| 2 | |
| 3 | |
| 4 | |
| 5 | |
| 6 | 10 |
| 7 | 116 |
| 8 | A |
| 9 | 1 |
| 10 | 115 |
| 11 | E |
| 12 | 10 |
| 13 | 115 |
| 14 | D |

| | |
|---|---|
| 15 | 2 |
| 16 | 114 |
| 17 | H |
| 18 | 6 |
| 19 | 113 |
| 20 | J |
| 21 | 10 |
| 22 | 112 |
| 23 | K |
| 24 | 1 |
| 25 | 112 |
| 26 | J |
| 27 | 3 |
| 28 | 111 |
| 29 | H |
| 30 | 10 |
| 31 | 110 |
| 32 | N |
| 33 | 10 |
| 34 | 109 |
| 35 | N |
| 36 | 10 |
| 37 | |

APPENDIX 3

BASKET File

| | |
|---|---|
| 1 | |
| 2 | |
| 3 | |
| 4 | |
| 5 | 10 |
| 6 | 110 |
| 7 | A |
| 8 | 9 |
| 9 | 110 |
| 10 | A |
| 11 | 10 |
| 12 | 113 |
| 13 | F |
| 14 | 2 |
| 15 | 115 |
| 16 | c |
| 17 | 4 |
| 18 | 112 |
| 19 | J |
| 20 | 6 |

| | |
|---|---|
| 21 | 114 |
| 22 | O |
| 23 | 10 |
| 24 | 109 |
| 25 | g |
| 26 | 10 |
| 27 | 111 |
| 28 | H |
| 29 | 2 |
| 30 | 114 |
| 31 | c |
| 32 | 1 |
| 33 | 115 |
| 34 | F |
| 35 | 10 |
| 36 | |
| 37 | |

APPENDIX 4

BB.PRN File

| | |
|---|---|
| 1 | |
| 2 | |
| 3 | |
| 4 | |
| 5 | |
| 6 | "109D-6-B" |
| 7 | "109I-6-B" |
| 8 | "109N-6-B" |
| 9 | "109e-6-B" |
| 10 | "109j-6-B" |
| 11 | "110D-5-A" |
| 12 | "110D-5-B" |
| 13 | "110I-5-A" |
| 14 | "110I-5-B" |
| 15 | "110N-6-A" |
| 16 | "110N-6-B" |
| 17 | "110e-4-A" |
| 18 | "110e-4-B" |
| 19 | "110j-5-A" |
| 20 | "110j-5-B" |
| 21 | "111D-4-A" |
| 22 | "111D-4-B" |
| 23 | "111I-6-A" |
| 24 | "111I-6-B" |
| 25 | "111N-7-A" |
| 26 | "111N-7-B" |

| | |
|---|---|
| 27 | "111e-4-A" |
| 28 | "111j-4-A" |
| 29 | "112D-4-A" |
| 30 | "112D-4-B" |
| 31 | "112I-6-A" |
| 32 | "112I-6-B" |
| 33 | "112N-6-A" |
| 34 | "112N-6-B" |
| 35 | "112e-4-A" |
| 36 | "112j-4-A" |
| 37 | "113D-4-A" |
| 38 | "113D-4-B" |
| 39 | "113I-6-A" |
| 40 | "113I-6-B" |
| 1 | "113N-8-A" |
| 2 | "113N-8-B" |
| 3 | "114D-5-A" |
| 4 | "114D-5-B" |
| 5 | "114I-6-A" |
| 6 | "114I-6-B" |
| 7 | "114N-6-A" |
| 8 | "114N-6-B" |
| 9 | "114b-4-A" |
| 10 | "114g-4-A" |
| 11 | "115D-8-A" |
| 12 | "115D-8-B" |
| 13 | "115I-8-A" |
| 14 | "115I-8-B" |
| 15 | "115N-8-A" |
| 16 | "115N-8-B" |
| 17 | "115b-8-A" |
| 18 | "115b-8-B" |
| 19 | "115g-8-A" |
| 20 | "115g-8-B" |
| 21 | "116D-9-A" |
| 22 | "116I-9-A" |
| 23 | "116N-9-A" |
| 24 | "116b-9-A" |
| 25 | "116g-9-A" |
| 26 | |

APPENDIX 5

1
2
3            CIRCUS.PRN file

| | |
|---|---|
| 4 | |
| 5 | |
| 6 | "109D-6-B" |
| 7 | "109I-6-B" |
| 8 | "109N-6-B" |
| 9 | "110D-5-A" |
| 10 | "110D-5-B" |
| 11 | "110I-5-A" |
| 12 | "110I-5-B" |
| 13 | "110N-6-A" |
| 14 | "110N-6-B" |
| 15 | "111D-4-A" |
| 16 | "111D-4-B" |
| 17 | "111I-6-A" |
| 18 | "111I-6-B" |
| 19 | "111N-7-A" |
| 20 | "111N-7-B" |
| 21 | "112D-4-A" |
| 22 | "112D-4-B" |
| 23 | "112I-6-A" |
| 24 | "112I-6-B" |
| 25 | "112N-6-A" |
| 26 | "112N-6-B" |
| 27 | "113D-4-A" |
| 28 | "113D-4-B" |
| 29 | "113I-6-A" |
| 30 | "113I-6-B" |
| 31 | "113N-8-A" |
| 32 | "113N-8-B" |
| 33 | "114D-5-A" |
| 34 | "114D-5-B" |
| 35 | "114I-6-A" |
| 36 | "114I-6-B" |
| 37 | "114N-6-A" |
| 38 | "114N-6-B" |
| 1 | "115D-8-A" |
| 2 | "115D-8-B" |
| 3 | "115I-8-A" |
| 4 | "115I-8-B" |
| 5 | "115N-8-A" |
| 6 | "115N-8-B" |
| 7 | "116D-9-A" |
| 8 | "116I-9-A" |
| 9 | "116N-9-A" |

APPENDIX 6

TOUR-3D.PRN file

```
*109D-6-B/111',8',200
*109I-6-B/125',8',268
*109N-6-B/139',8',338
*109e-6-B/83',8',96
*109j-6-B/97',8',146
*1   -5-A/111',22',200
*110D-5-B/111',31',200
*110I-5-A/125',22',268
*110I-5-B/125',32',268
*110N-6-A/139',22',338
*110N-6-B/139',34',338
*110e-4-A/83',22',96
*110e-4-B/83',28',96
*110j-5-A/97',22',146
*110j-5-B/97',28',146
*111D-4-A/110',38',200
*111D-4-B/106',48',200
*111I-6-A/123',41',268
*111I-6-B/118',54',268
*111N-7-A/136',45',338
*111N-7-B/130',61',338
*111e-4-A/81',33',96
*111j-4-A/93',40',146
*112D-4-A/99',56',200
*112D-4-B/94',61',200
*112I-6-A/112',63',268
*112I-6-B/102',73',268
*112N-6-A/127',70',338
*112N-6-B/112',84',338
*112e-4-A/76',42',70
*112j-4-A/88',49',130
*113D-4-A/86',65',200
*113D-4-B/77',71',200
*113I-6-A/92',80',268
*113I-6-B/80',83',268
*113N-8-A/98',92',338
*113N-8-B/84',96',338
```

```
*114D-5-A/68',73',200
*114D-5-B/58',73',200
*114I-6-A/69',87',268
*114I-6-B/58',87',268
*114N-6-A/70',101',338
*114N-6-B/58',101',338
*114b-4-A/58',44',70
*114g-4-A/58',58',130
*115D-8-A/42',73',200
*115D-8-B/27',73',200
*115I-8-A/42',87',268
*115I-8-B/27',87',268
*115N-8-A/42',101',338
*115N-8-B/27',101',338
*115b-8-A/42',44',70
*115b-8-B/27',44',70
*115g-8-A/42',58',130
*115g-8-B/27',58',130
*116D-9-A/9',73',200
*116I-9-A/9',87',268
*116N-9-A/9',101',338
*116b-9-A/9',44',70
*116g-9-A/9',58',130
```

APPENDIX 7

TOUR-3D.LSP

```
; Program Name: TOUR-3D.LSP
;
; Date: 12 July 1991
;
; Written By: Robert Delgado
;
;
; Lisp program for reading a file containing Acad
; slide file names
;
(defun C:TOUR-3D (/ F SS R1 R2 R3)
   (SETQ F (OPEN "E:TOUR-3D.PRN" "r"))
   (WHILE (= (SUBSTR (SETQ R1 (READ-LINE F)) 1 1) "*")
      (SETQ R2 (STRCAT "E:" (SUBSTR R1 2 8)))
```

```
20      (SETQ R3 (SUBSTR R1 11))
21      (COMMAND "VSLIDE" R2)
22    )
23    (CLOSE F)
24  )
```

APPENDIX 8

VIEW-3D.LSP

```
; Program Name: VIEW-3D.LSP
;
; Date: 01 July 1991
;
; Written By: Robert Delgado
;
; Lisp program for reading a file containing 3D coordinates and
; view names. Then looping these coordinates to generate
; hidden-line slide files of the view.
;
(defun C:VIEW-3D (/ F SS R1 R2 R3)
  (SETQ F (OPEN "E:3D.PRN" "r"))
  (SETQ SS (SSADD))
  (SETQ SS (SSGET "X" (LIST (CONS 0 "LINE") (CONS 8 "3D-PLAT"))))
  (WHILE (= (SUBSTR (SETQ R1 (READ-LINE F)) 1 1) "*")
    (SETQ R2 (STRCAT "E:" (SUBSTR R1 2 8)))
    (SETQ R3 (SUBSTR R1 11))
    (COMMAND "dview" SS "" "po" "" R3 "X")
    (COMMAND "HIDE")
    (COMMAND "MSLIDE" R2)
  )
  (CLOSE F)
)
```

APPENDIX 9

3D-BOWL.MNU

```
***BUTTONS
;
^O
```

```
8    ^CREDRAW
9    ***SCREEN
10   **S
11   [ 3 - D ]^CCHANGE;\;;;ARCHSTYL;;;;
12   [--- SP ]^CCOPY;\;\\DDATTE;L;
13   [Ddatte  ]^CDDATTE
14   [Extend  ]^CExtend
15   [--- LT ]^CCHANGE;\;P;LT;DASHDOT;;
16   [Break F ]^CBreak \F;
17   [ Break I]^CBREAK;\F;INT;\INT
18   [3d-fac I]^C3dface;int;\int;\int;\int;
19   [3d-fac E]^C3dface;i;end;\end;\i;end;\end;\;
20   [M -1'-9"]^CMove;c;\\c;\\;\@0,0,-1'9;;
21   [M -1'8/8]^CMove;c;\\c;\\;\@0,0,-1'8-5/8;;
22   [-------T]^Cline end;\per;\;OFFSET;3';\\;TRIM W;
23   [Chng Lyr]^CCT
24   [Fillet  ]^CFillet
25   [Offset 8]^COffset;8;\\;
26   [Trim    ]^cTrim;
27   [Partt   ]^cinsert;partt;\;;\
28   [copy    ]^Ccopy;\;\\
29   [stretch ]^Cstretch
30   [-------R]^CInsert dr300r drag int;\1;1;drag;\move I;;@0,0;@8<\
31   [ Zoom W ]^CZW
32   [ Pan    ]^CPN
33   [ Zoom P ]^CZP
34   [-------L]^CInsert dr300l drag int;\1;1;drag;\move I;;@0,0;@8<\
35   [AcadMenu]^CMenu acad
36   [C/A Menu]^CMenu ca-root
37   ***POP5
38   **P5
39   [Lighting]
40   [Zoom E  ]^CZOOM E
1    [--     ]^C
2    [Bird Off]^CBD
3    [Bird On ]^CB3
4    [--     ]^C
5    [Save   ]^CSAVE;;
6    [--     ]^C
7    [View R ]^CVIEW R LZA
8    [--     ]^C
9    [Zoom All]^CZ1
10
```

We claim:

It will be appreciated that the foregoing embodiment is described for purposes of illustration and not as a limitation on the exclusive rights of the inventors. Various changes may be made (e.g., through the substitution of components; implementation of software functions in hardware and vice versa; and the like) without departing from the spirit of the invention. The embodiments which are claimed as the exclusive property of the inventors are as described in the claims below.

What is claimed is:

1. Apparatus for graphically displaying a view from a selected seat in a multi-seat assembly facility, each said seat having a respective view from said seat, said apparatus comprising:
   (a) a programmable processor subsystem;
   (b) a proxy seat data structure readable by said processor subsystem and encoding information concerning a plurality of said seats in the facility that are specified as proxy seats, wherein the view from each said proxy seat is specified as approximating the view from one or more respective said seats within the facility;
   (c) said proxy seat data structure including visual display data depicting the respective view from each proxy seat;
   (d) a monitor subsystem receiving a display input from the processor subsystem;
   (e) a user input subsystem delivering an input signal from a user to the processor subsystem;
   (f) said processor subsystem being programmed:
      (1) to receive an input from the user, said input encoding information identifying said selected seat;
      (2) to search the proxy seat data structure to select a proxy seat corresponding to the selected seat in accordance with a specified search strategy; and
      (3) to display on the monitor subsystem visual display data depicting the view from selected proxy seat.

2. A method for displaying to a user a perspective view of an assembly facility from a selected seat in the facility for a selected event occurring at the facility, comprising the steps of:
   (a) receiving from the user an event input signal encoding the user's selection of said event, and a seat-selection input signal encoding a tentative seat selection;
   (b) searching a proxy seat data structure, said proxy seat data structure encoding information concerning a plurality of seats in the facility that are specified as proxy seats, wherein the view from each said proxy seat is specified as approximating the view from one or more respective said seats within the facility the selected event, to produce a proxy-seat signal encoding an identification of a selected proxy seat corresponding to the tentative seat selection; and
   (c) displaying to the user a visual representation of the view from the selected proxy seat.

3. The method of claim 2, further comprising the step, executed prior to step 2(b), of displaying to the user a respective visual representation of the view from each of a series of said proxy seats.

4. An automated ticket selection machine for obtaining a ticket for a selected seat at a selected event, comprising:
   (a) means for receiving from a customer an event selection;
   (b) means for receiving from the customer a tentative seat selection;
   (c) means for displaying to the customer a perspective view from a proxy seat wherein the view from said proxy seat approximates the view from the selected seat;
   (d) means for receiving from the customer a yes or no confirmation signal indicating whether or not the tentative seat selection is to be confirmed.

5. The automated ticket selection machine claim 4, further comprising ticket output means for printing a ticket corresponding to the seat selection.

6. The automated ticket dispensing machine of claim 4, further comprising means for receiving a payment input signal from the customer.

* * * * *